(12) United States Patent
Takahashi

(10) Patent No.: US 6,874,959 B2
(45) Date of Patent: Apr. 5, 2005

(54) KEYBOARD ASSEMBLY

(75) Inventor: Nobuyuki Takahashi, Fujisawa (JP)

(73) Assignee: Minebea Co., Ltd., Nagano (JP)

( * ) Notice: Subject to any disclaimer, the term of this patent is extended or adjusted under 35 U.S.C. 154(b) by 17 days.

(21) Appl. No.: 10/396,150

(22) Filed: Mar. 25, 2003

(65) Prior Publication Data

US 2003/0219298 A1 Nov. 27, 2003

(30) Foreign Application Priority Data

Mar. 25, 2002 (JP) ........................................ 2002-084062

(51) Int. Cl.[7] .............................................. H01R 12/12
(52) U.S. Cl. .................... 400/472; 174/250; 174/261
(58) Field of Search .......................... 400/472; 174/250, 174/261, 260, 267; 349/152; 361/777

(56) References Cited

U.S. PATENT DOCUMENTS

| | | | | |
|---|---|---|---|---|
| 5,436,412 A | * | 7/1995 | Ahmad et al. | 174/265 |
| 6,052,171 A | * | 4/2000 | Kawaguchi | 349/149 |
| 2002/0038724 A1 | * | 4/2002 | Park et al. | 174/261 |
| 2002/0053466 A1 | * | 5/2002 | Kusui | 174/260 |
| 2002/0185304 A1 | * | 12/2002 | Sakai et al. | 174/257 |

FOREIGN PATENT DOCUMENTS

JP  05327155 A  * 12/1993  ............ H05K/1/11

OTHER PUBLICATIONS

Machine translation of JP 05327155 to Nokimura from Japanese Patent Office website.*

* cited by examiner

*Primary Examiner*—Daniel J. Colilla
(74) *Attorney, Agent, or Firm*—Joel Lutzker, Esq.; Anna Vishev, Esq.; Schulte Roth Zabel LLP

(57) ABSTRACT

A keyboard assembly having a keyboard membrane and a set of electrical connections. The keyboard membrane includes conductors arranged on the membrane to convey electrical signals generated by depression and/or release of keyboard keys to electrical terminals affixed to the membrane. The electrical connections are made between the membrane terminals and corresponding mutually-opposing terminals of a printed circuit board affixed within the body of the keyboard. The connections are arranged in first and second linear rows. The first row of connections is arranged at a uniform spacing in a direction approximately parallel to a long dimension of the membrane. The connections of the second row are arranged at a uniform spacing in a direction approximately perpendicular to the long dimension. An inter-terminal pitch among the connections of the first row is substantially greater than a inter-terminal pitch among the connections of the second row.

20 Claims, 3 Drawing Sheets

KEYBOARD ASSEMBLY

CROSS-REFERENCE

This application claims priority from Japanese application serial no. 2002-084062, filed Mar. 25, 2002, which is incorporated by reference.

BACKGROUND

This invention relates to data-entry keyboards, for example, keyboards of the type typically used with computers.

In membrane-type keyboards, electrical switches or sensors, one for each key of the keyboard, are arranged on a membrane. The membrane is typically a thin sheet of plastic. The membrane lies flat on a keyboard frame or base plate. As a key is depressed or released, the corresponding switch or sensor controls an electrical signal on one or more wires that are disposed on the membrane. These wires extend from the site of each switch or sensor to an electrical interconnect region of the membrane, where electrical connections are made between the wires on the membrane and the rest of the keyboard, typically at a rigid contact mounting. This contact mounting is typically a printed circuit board (PCB). Typically, this PCB is located in the upper-right corner of the keyboard, above the numeric keypad at the right of the keyboard and to the right of the row of "PF" keys, or toward the bottom of the keyboard. Typically, this PCB mounts electronics for decoding the signals on the wires to determine which key was pressed or released, and for generating signals that convey this key information to a computer. This PCB may also include LED's or other display elements to show "caps lock" or other status information. These functions may be divided between two or more PCB's located at several places throughout the keyboard.

SUMMARY

The invention relates to a keyboard assembly having a keyboard membrane and a set of electrical connections. The keyboard membrane includes conductors arranged on the membrane to convey electrical signals generated by depression-and/or release of keyboard keys to electrical terminals affixed to the membrane. The electrical connections are made between the membrane terminals and corresponding mutually-opposing terminals of a printed circuit board affixed within the body of the keyboard. The connections are arranged in first and second linear rows. The first row of connections is arranged at a uniform spacing in a direction approximately parallel to a long dimension of the membrane. The connections of the second row are arranged at a uniform spacing in a direction approximately perpendicular to the long dimension. An inter-terminal pitch among the connections of the first row is substantially greater than an inter-terminal pitch among the connections of the second row.

The present invention also features a rigid mounting for electrical terminals for making electrical contact with conductors of a keyboard membrane. A set of electrical terminals is affixed on a rigid substrate of the mounting and is arranged to make electrical contact with corresponding mutually-opposing terminals arranged on the membrane. The set has a first inter-terminal pitch measured in a direction approximately parallel to a long dimension of the membrane, and a second inter-terminal pitch measured in a direction approximately perpendicular to the long dimension. The second pitch is substantially finer than the first pitch.

The invention further features a keyboard membrane. Conductors are arranged on the membrane to convey electrical signals generated by depression and/or release of keyboard keys to electrical terminals affixed to the membrane. A set of electrical terminals affixed on the membrane are arranged to make electrical contact with corresponding mutually-opposing terminals rigidly affixed relative to a body of the keyboard. The set has a first inter-terminal pitch measured in a direction approximately parallel to a long dimension of the membrane, and a second inter-terminal pitch measured in a direction approximately perpendicular to the long dimension. The second pitch is substantially finer than the first pitch.

The invention also includes a method of forming the keyboard assembly. The method includes providing a keyboard membrane having conductors arranged thereon to convey electrical signals generated by depression and/or release of keyboard keys to electrical terminals affixed to the membrane. The electrical terminals are arranged at a first inter-terminal pitch measured in a direction approximately parallel to a long dimension of the membrane, and at a second inter-terminal pitch measured in a direction approximately perpendicular to the long dimension. The second pitch is substantially finer than the first pitch. A rigid mounting is provided, having electrical terminals arranged to make electrical contact with corresponding mutually-opposing membrane electrical terminals. The keyboard membrane and the rigid mounting are assembled in a keyboard body with the mounting electrical terminals in electrical contact with corresponding ones of the membrane electrical terminals.

Embodiments of the invention may include one or more of the following features. The terminals may be arranged in two linear rows, a first row being arranged in a direction approximately parallel to the long dimension, and a second row being arranged in a direction approximately perpendicular to the long dimension. A width dimension of terminals of one of the first and second rows may be substantially wider than a width dimension of corresponding terminals of the membrane. A ratio of the second pitch to the first pitch may be between about 0.4 and 0.7. A ratio of the second pitch to the first pitch may be between about 0.5 and 0.6. A hold-down cushion may be mounted in opposition to the set of terminals, the hold-down cushion being mounted on a keyboard frame, base plate, or other rigid portion of the keyboard body. The hold-down cushion may be arranged to elastically urge the terminals arranged on the membrane into electrical contact with corresponding ones of the set of electrical terminals. A substrate of the rigid mounting may be a printed circuit board. The keyboard membrane may be configured to be disposed on a keyboard frame or base plate.

The above advantages and features are of representative embodiments only. It should be understood that they are not to be considered limitations on the invention as defined by the claims. Additional features and advantages of the invention will become apparent in the following description, from the drawings, and from the claims.

BRIEF DESCRIPTION OF THE DRAWINGS

The invention is illustrated by way of example and not limitation and the figures of the accompanying drawings in which like references denote like or corresponding parts, and in which.

DESCRIPTION

Figure 1:
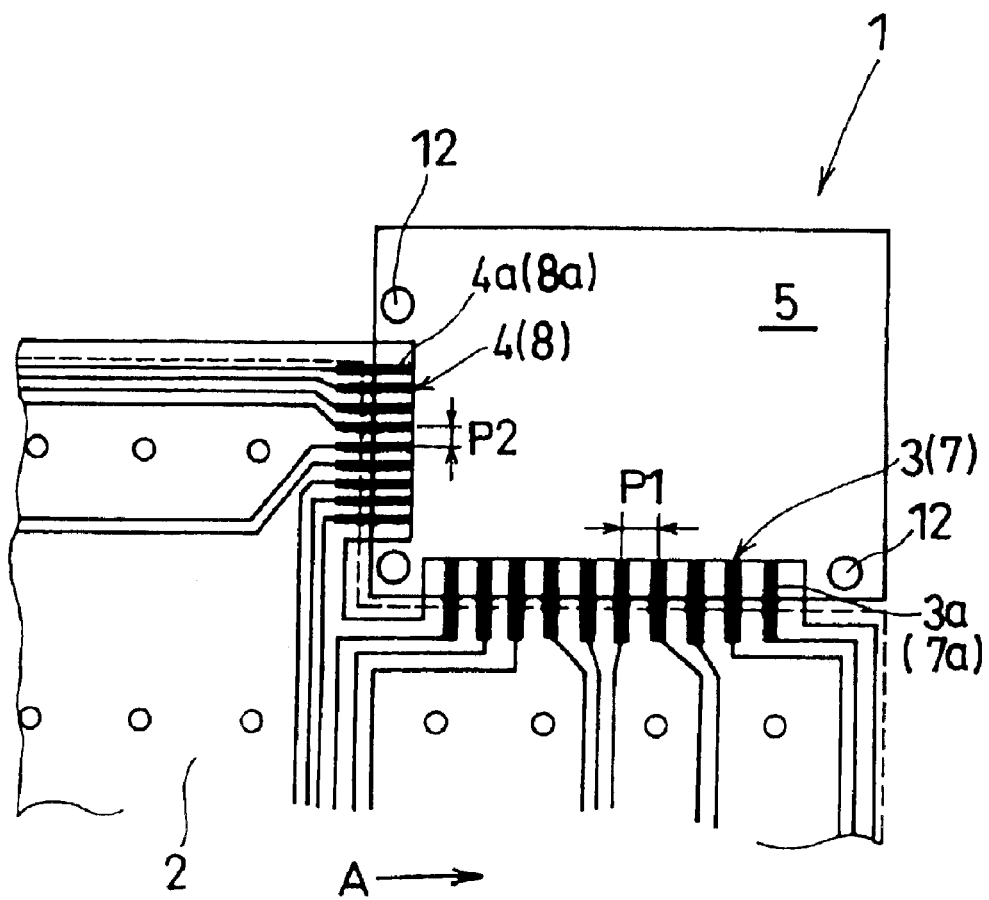
FIG. 1 is a plan view of a keyboard electrical connection.

Referring to FIG. 1, which provides a detailed view of the assembly structure 1, electrical connections between membrane 2 and PCB 5 are arranged in two rows, approximately perpendicular to each other. In one row of connections 3, 7, arranged parallel to long dimension A of membrane 2, the connections are arranged at one inter-connection pitch. In a second row of connections 4, 8, arranged perpendicular to long dimension A of membrane 2, the connections are arranged at a second, finer inter-connection pitch. Each connection between membrane 2 and PCB 5 is formed as one electrical contact 3, 4 on membrane 2, and an opposing electrical contact 7, 8 formed on PCB 5. Membrane 2 and PGB 5 are assembled so that membrane-side electrical contacts 3, 4 are brought into opposing contact with PCB-side electrical contacts 7, 8.

Keyboard membrane 2 may be subject to dimensional changes or pulling, for example, due to temperature changes, age, keyboard distortion, or bending stress. In addition, the components may be designed to accommodate some dimensional tolerance during manufacturing. As membrane 2 shrinks or pulls relative to PCB 5, or where membrane 2 is at the low end of its dimensional tolerance, membrane 2 may tend to displace membrane-side contacts 3, 4 relative to PCB-side contacts 7, 8. For example, in the arrangement shown in FIG. 1, contacts 3, 4 may be pulled to the left as membrane 2 shrinks or pulls. Accommodation of dimensional changes in membrane 2 may be improved by widening the inter-connection pitch P1, P2, especially among connections 3, 7 in the dimension parallel to long dimension A of membrane 2, or by arranging electrical connections 3, 4, 7, 8 with differing pitches. In some cases, it may be possible to narrow inter-connection pitch P2 in the dimension perpendicular to dimension A (vertical in FIG. 1), where the displacement or pulling effect on membrane 2 are smaller. In some cases, electrical connections 3, 4, 7, 8 may improve reliability of the electrical connections between membrane 2 and PCB 5. In some cases, arranging electrical connections 3, 4, 7, 8 with differing pitches may allow an increased number of connections between a PCB and a keyboard membrane, or may allow the same number of connections to be arranged in a reduced space. In some cases, the arrangement may reduce costs of manufacture or assembly.

A first array of electrical contacts 3 may be arranged on membrane 2 in a direction parallel to long dimension A of membrane 2. A second array of contacts 4 may be arranged on membrane 2 in a direction perpendicular to first array 3. First array 3 and second array 4 may be positioned surrounding a rectangular cut-out in the upper-right corner of membrane 2, in a space formed above the period key of the numeric keypad of a typical keyboard.

PCB 5 may include a third contact array 7, arranged in opposition to first membrane-side contact array 3, in a row parallel to long dimension A of membrane 2. PCB 5 may also include a fourth contact array 8, arranged in opposition to second membrane-side contact array 4, in a row perpendicular to long dimension A. In some cases, contacts 7, 8 may be arranged along two edges of PCB 5.

Membrane 2 and PCB 5 respective contact arrays (3, 4, 7, 8) may include a number of contacts (3a, 4a; 7a, 8a) in mutually corresponding positions. In the example of FIG. 1, there are ten connections 3, 7 in the first and third contact arrays and nine connections 4, 8 in the second and fourth contact arrays. Pitch P2 between second and fourth contact arrays 4, 8 may be smaller than pitch P1 of the first and third contact arrays 3, 7. In most cases, the pitch P1 or P2 within either of the two arrays will be uniform, though this is not necessary.

Electrical connections between membrane 2 and PCB 5 are established when opposing contacts 3, 4, 7, 8 are brought together. These electrical connections convey the signals generated by depression and/or releases of keyboard keys to PCB 5. PCB 5 may include an electronic circuit (not shown) designed to control the communication of signals to and from the computer CPU, to control LED's or other indicators on the keyboard, etc.

Figure 2:
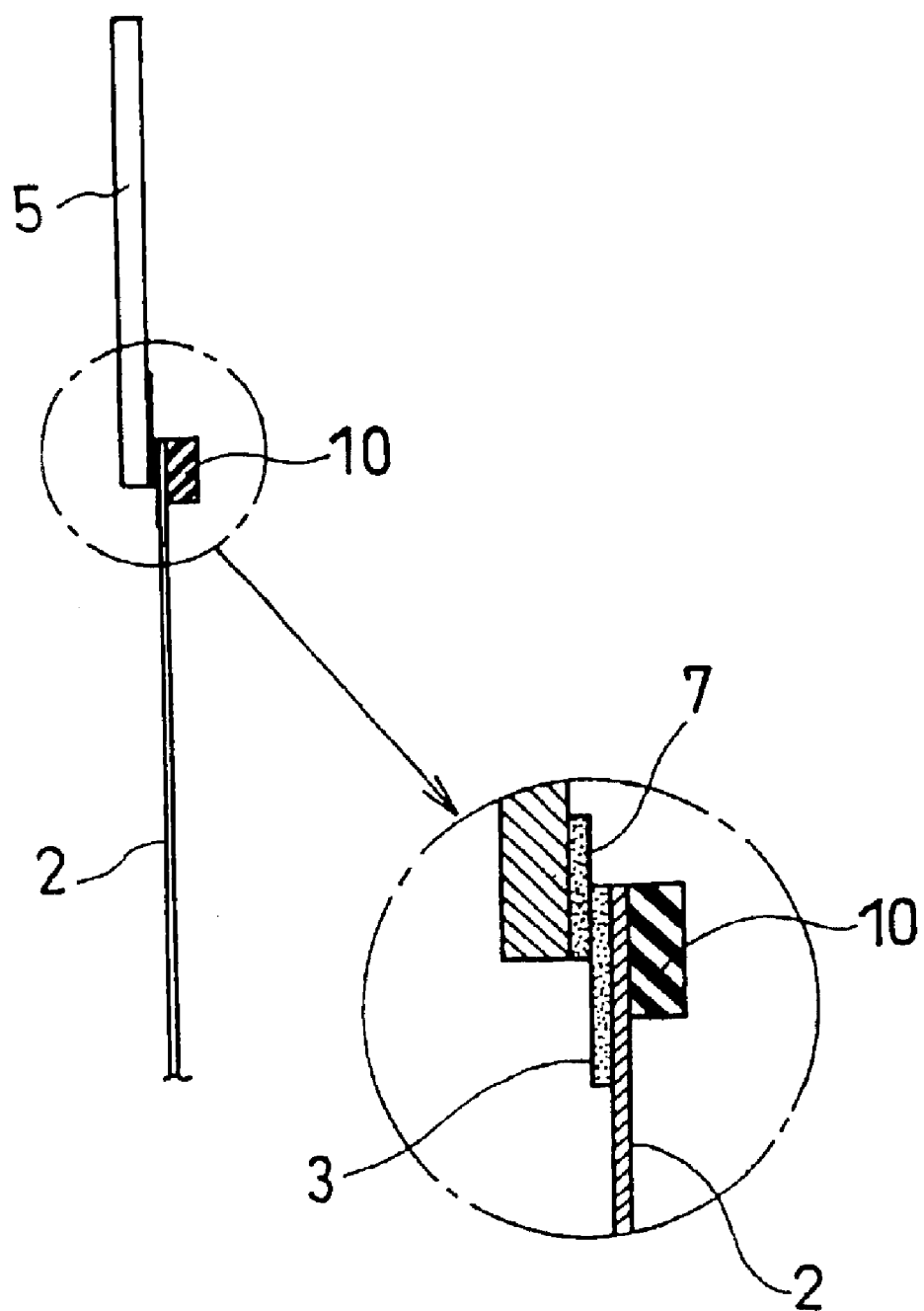
FIG. 2 is a side view and expanded view of a keyboard electrical connection.

Referring to FIG. 2, electrical contact between membrane-side contact arrays 3, 4 and PCB-side contacts 7, 8 may be established by sandwiching membrane 2 between hold-down cushion 10 and PCB 5. Hold-down cushion 10 may be affixed to the keyboard frame, base plate or some other rigid portion of the keyboard body, registered in a location that will correspond to connection arrays 3, 4, 7, 8. In one example method of assembly, connections 3, 4, 7, 8 may be established by laying membrane 2 in the floor of the keyboard body, with contacts 3, 4 arranged on top of hold-down cushion 10. Then, PCB 5 is laid down, with PCB-side contacts 7, 8 arranged on top of membrane-side contacts 3, 4. Then, PCB 5 is secured by screws through attachment holes 12 through PCB 5. There are typically at least three such attachment holes 12 at respective corners of PCB 5. Hold-down cushion 10 may be arranged so that it will press membrane-side contacts 3, 4 against PCB-side contacts 7, 8 at a specified pushing force. This force may be chosen to substantially suppress movement of membrane-side contacts 3, 4 and to ensure reliable connection of contacts 3, 4, 7, 8.

Figure 3:
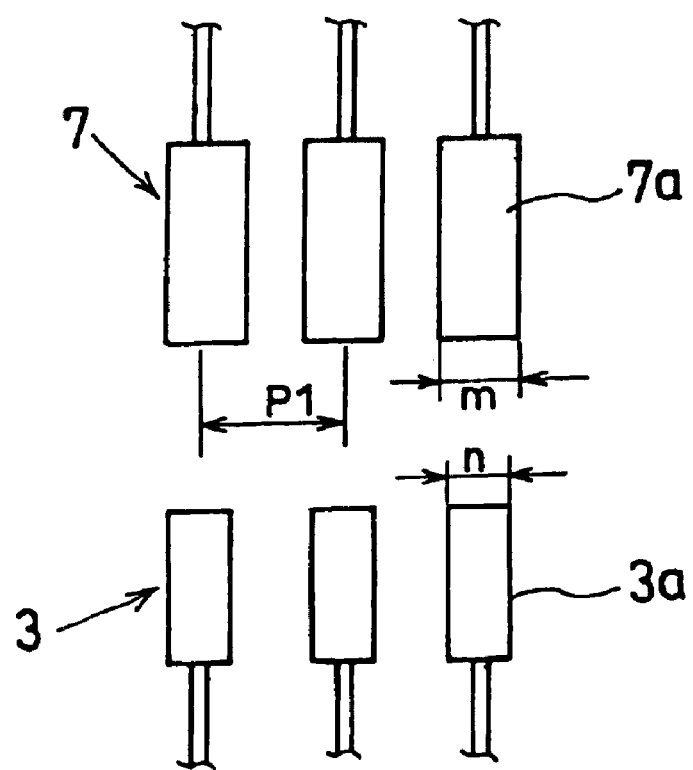
FIG. 3 is a plan view showing inter-contact pitch and contact width dimensions.

Referring to FIG. 3, a typical keyboard membrane may have a vertical height of approximately 150–175 mm, and a horizontal width (dimension A) approximately three times larger. In such an example, it is desirable that the design of connections 4, 8 tolerate variations of up to approximately 0.3 mm in the vertical dimension of membrane 2, or displacements from center of approximately 0.15 mm between contacts 4, 8. Similarly, it may be desirable to allow displacements between contacts 3, 7 (arrayed parallel to long dimension A of membrane 2) in the range of 0.4+0.15 mm from the contact center point. In order to maintain electrical contact between opposing contacts, the sum of the width of the membrane-side contact 4 and the width of the PCB-side contact 8 may be greater than twice the expected displacement. In order to prevent a short between a membrane-side contact 4 and the next-adjoining PCB-side contact 8, the inter-contact pitch P1, P2 may be greater than the expected displacement plus half the sum of the widths of the contacts.

In some cases, width n of membrane-side contacts 3, 4 may be smaller than width m of the corresponding PCB-side contacts 7, 8. In some cases, membrane-side width n may be larger than PCB-side width m. In some cases, width n may be about equal to width m.

In one case, pitch P1 between contacts in connection array 3, 7 laying parallel to long dimension A of membrane 2 may be P1=2.34 mm, width m of PCB-side contacts 7 may be approximately 1.4 mm, and width n of membrane-side contacts 3 may be approximately 1.2 mm. Pitch P2 between contacts in connection array 4, 8 laying perpendicular to dimension A may be 1.2 mm, or may narrowed to 1.0 mm, width m of PCB-side contacts 8 may be about 1 mm, and width n of membrane-side contacts 4 may be about 0.8 mm.

The ratio of pitch P2 to pitch P1 may be between 0.3 and 0.9, or more preferably, between 0.4–0.7, or more preferably, between 0.5 and 0.6. In the examples discussed above, the ratio ranges between about 0.427 and about 0.513.

For the convenience of the reader, the above description has focused on a representative sample of all possible embodiments, a sample that teaches the principles of the invention and conveys the best mode contemplated for carrying it out. The description has not attempted to exhaustively enumerate all possible variations. Other undescribed variations or modifications may be possible. For example, where multiple alternative embodiments are described, in many cases it will be possible to combine elements of different embodiments, or to combine elements of the embodiments described here with other modifications or variations that are not expressly described. Many of those undescribed variations, modifications and variations are within the literal scope of the following claims, and others are equivalent.

The invention claimed is:

1. A keyboard assembly, comprising:
    a keyboard membrane, the membrane including conductors arranged on the membrane to convey electrical signals generated by depression and/or release of keyboard keys to electrical terminals affixed to the membrane;
    a set of electrical connections between the membrane terminals and corresponding mutually-opposing terminals disposed on a printed circuit board being affixed within the body of the keyboard, the connections being arranged in first and second linear rows, the first row of connections being arranged at a uniform spacing in a direction approximately parallel to a long dimension of the membrane, the connections of the second row being arranged at a uniform spacing in a direction approximately perpendicular to the long dimension; and
    an inter-terminal pitch among the connections of the first row being substantially greater than an inter-terminal pitch among the connections of the second row.

2. The keyboard assembly of claim 1, further comprising a hold-down cushion affixed to a frame or base plate of the keyboard, and arranged to sandwich the membrane terminals between the printed circuit board terminals and the hold-down cushion.

3. The keyboard assembly of claim 1, wherein a width dimension of said membrane terminals is smaller than a width dimension of the corresponding printed circuit board terminals.

4. The keyboard assembly of claim 1, wherein the pitch of the second row connections falls within a range of 0.4 to 0.7 times the pitch of the first connection row connections.

5. The keyboard assembly of claim 1, wherein the membrane is disposed on a keyboard frame or base plate.

6. A rigid mounting for electrical terminals, comprising:
    a keyboard membrane having conductors thereon;
    a set of electrical terminals being capable of vertical and horizontal dimensional displacement and affixed on a rigid substrate of the mounting and being arranged to make electrical contact with corresponding mutually-opposing conductors of the keyboard membrane, the set having a first inter-terminal pitch measured in a direction approximately parallel to a long dimension of the membrane, and a second inter-terminal pitch measured in a direction approximately perpendicular to the long dimension; and
    the second pitch being substantially finer than the first pitch.

7. The rigid mounting of claim 6, wherein:
    the set of terminals is arranged in two linear rows comprising:
    a first row being arranged in a direction approximately parallel to the long dimension, and a second row being arranged in a direction approximately perpendicular to the long dimension.

8. The rigid mounting of claim 7, wherein a width dimension of terminals of one of the first and second rows is substantially wider than a width dimension of corresponding terminals of the membrane.

9. The rigid mounting of claim 6, wherein a ratio of the second pitch to the first pitch is between about 0.4 and 0.7.

10. The rigid mounting of claim 9, wherein a ratio of the second pitch to the first pitch is between about 0.5 and 0.6.

11. The rigid mounting of claim 6, further comprising a hold-down cushion mounted in opposition to the set of terminals, the hold-down cushion being mounted on a keyboard frame, base plate, or other rigid portion of the keyboard body, and being arranged to elastically urge the terminals arranged on the membrane into electrical contact with corresponding ones of the set of electrical terminals.

12. The rigid mounting of claim 6, wherein a said substrate of the rigid mounting is a printed circuit board.

13. A keyboard membrane, comprising:
    conductors arranged on the membrane to convey electrical signals generated by depression and/or release of keyboard keys to electrical terminals affixed to the membrane; and
    a set of electrical terminals affixed on the membrane and being arranged to make electrical contact with corresponding mutually-opposing terminals rigidly affixed relative to a body of the keyboard, the set having a first inter-terminal pitch measured in a direction approximately parallel to a long dimension of the membrane, and a second inter-terminal pitch measured in a direction approximately perpendicular to the long dimension, the second pitch being substantially finer than the first pitch.

14. The keyboard membrane of claim 13, wherein:
    the set of terminals is arranged in two linear rows, a first of the rows being arranged in a direction approximately parallel to the long dimension, and a second of the rows being arranged in a direction approximately perpendicular to the long dimension.

15. The keyboard membrane of claim 13 wherein a width dimension of terminals of one of the first and second rows is substantially wider than a width dimension of corresponding terminals of the membrane.

16. The keyboard membrane of claim 13, wherein a ratio of the second pitch to the first pitch is between about 0.4 and 0.7.

17. The keyboard membrane of claim 16, wherein a ratio of the second pitch to the first pitch is between about 0.5 and 0.6.

18. The keyboard membrane of claim 13, further comprising a hold-down cushion mounted in opposition to the set of terminals, the hold-down cushion being mounted on a keyboard frame, base plate, or other rigid portion of the keyboard body, and being arranged to elastically urge the terminals arranged on the membrane into electrical contact with corresponding ones of the set of electrical terminals.

19. The keyboard membrane of claim 13, being configured to be disposed on a keyboard frame or base plate.

20. A method of forming a keyboard assembly, comprising the steps of:

providing a keyboard membrane, the membrane comprising:

conductors arranged on the membrane to convey electrical signals generated by depression and/or release of keyboard keys to electrical terminals affixed to the membrane; and a set of electrical terminals affixed on the membrane, the electrical terminals arranged at a first inter-terminal pitch measured in a direction approximately parallel to a long dimension of the membrane, and at a second inter-terminal pitch measured in a direction approximately perpendicular to the long dimension, the second pitch being substantially finer than the first pitch;

providing a rigid mounting having electrical terminals arranged to make electrical contact with corresponding mutually-opposing ones of the membrane electrical terminals; and assembling the keyboard membrane and the rigid mounting in a keyboard body with mounting electrical terminals in electrical contact with corresponding ones of the membrane electrical terminals.

* * * * *